(12) United States Patent
Meyer

(10) Patent No.: US 9,083,152 B2
(45) Date of Patent: Jul. 14, 2015

(54) SEMICONDUCTOR OPTICAL AMPLIFIER DEVICE AND OPTICAL MATRIX SWITCH

(75) Inventor: Gerhard Meyer, Eggolsheim (DE)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/007,850

(22) PCT Filed: Apr. 4, 2012

(86) PCT No.: PCT/EP2012/056147
§ 371 (c)(1),
(2), (4) Date: Sep. 26, 2013

(87) PCT Pub. No.: WO2012/150104
PCT Pub. Date: Nov. 8, 2012

(65) Prior Publication Data
US 2014/0022628 A1    Jan. 23, 2014

(30) Foreign Application Priority Data
May 4, 2011   (EP) .................................... 11290214

(51) Int. Cl.
*H01S 5/40*     (2006.01)
*H01S 5/50*     (2006.01)
*H01S 5/22*     (2006.01)
(Continued)

(52) U.S. Cl.
CPC ............. *H01S 5/4031* (2013.01); *H01S 5/4087* (2013.01); *H01S 5/50* (2013.01); *G02B 6/3546* (2013.01); *H01S 5/0071* (2013.01); *H01S 5/0267* (2013.01); *H01S 5/22* (2013.01); *H01S 5/5072* (2013.01); *H04J 14/0212* (2013.01)

(58) Field of Classification Search
CPC .................................. H01S 5/4068; H01S 5/50
USPC .......................................................... 359/344
See application file for complete search history.

(56) References Cited

U.S. PATENT DOCUMENTS 4,723,252 A * 2/1988 Botez et al. ............... 372/46.012
4,757,268 A * 7/1988 Abrams et al. ................ 359/338

(Continued)

FOREIGN PATENT DOCUMENTS

EP          0851548 A1    7/1998
WO     WO-01/61389 A2    8/2001

OTHER PUBLICATIONS

Goldberg, L. et al.: "Injection locking of coupled-stripe diode laser arrays"; AIP, American Institute of Physics; Applied Physics Letters vol. 46, No. 3, p. 236-238; Woodbury, NY; Feb. 1985;xp000706385.

(Continued)

*Primary Examiner* — Ari M Diacou
(74) *Attorney, Agent, or Firm* — Harness, Dickey & Pierce, P.L.C.

(57) ABSTRACT

The semiconductor optical amplifier device includes a plurality of active units. Each active unit includes an active stripe structure of an optical amplifying medium and a current circuit configured to inject current into the corresponding active stripe structure. Each active stripe structure extends from an input end to an output end. An optical splitter device is configured to split an incoming signal light and for distributing corresponding parts of the incoming signal light into the different input ends of the active stripe structures. The optical splitter device is configured to supply each active stripe structure with the same signals.

10 Claims, 4 Drawing Sheets

(51) Int. Cl.
*H01S 5/026* (2006.01)
*H04J 14/02* (2006.01)
*G02B 6/35* (2006.01)
*H01S 5/00* (2006.01)

(56) References Cited

U.S. PATENT DOCUMENTS

| | | | | |
|---|---|---|---|---|
| 5,013,113 | A | * | 5/1991 | Soref ............................... 385/17 |
| 5,223,972 | A | * | 6/1993 | Nishimura et al. ........... 359/337 |
| 5,305,412 | A | | 4/1994 | Paoli |
| 5,321,714 | A | * | 6/1994 | Paoli .......................... 372/50.22 |
| 5,325,388 | A | * | 6/1994 | Gupta et al. ................. 372/50.1 |
| 5,454,058 | A | * | 9/1995 | Mace et al. ................... 385/122 |
| 5,654,822 | A | * | 8/1997 | Ducellier et al. ............. 359/344 |
| 5,692,001 | A | * | 11/1997 | Tiemeijer ................... 372/44.01 |
| 5,828,679 | A | * | 10/1998 | Fisher .............................. 372/6 |
| 6,366,382 | B1 | | 4/2002 | Morthier et al. |
| 6,597,497 | B2 | * | 7/2003 | Wang et al. .................. 359/344 |
| 6,771,847 | B2 | * | 8/2004 | Mukai ............................. 385/14 |
| 7,130,112 | B2 | * | 10/2006 | Morito ......................... 359/344 |
| 7,177,337 | B2 | * | 2/2007 | Takagi ............................ 372/64 |
| 7,643,207 | B2 | * | 1/2010 | Dagens et al. ................ 359/344 |
| 7,911,686 | B2 | * | 3/2011 | Nakagawa et al. ........... 359/344 |
| 2002/0076133 | A1 | * | 6/2002 | Li et al. ........................... 385/16 |
| 2003/0063631 | A1 | * | 4/2003 | Corcoran ........................ 372/18 |
| 2003/0067675 | A1 | * | 4/2003 | Wang et al. ................... 359/344 |
| 2003/0067676 | A1 | * | 4/2003 | Wang et al. ................... 359/344 |
| 2004/0190126 | A1 | * | 9/2004 | Takagi .......................... 359/344 |
| 2004/0196543 | A1 | * | 10/2004 | Akiyama ....................... 359/344 |
| 2005/0259317 | A1 | * | 11/2005 | Dagens et al. ................ 359/344 |
| 2009/0147352 | A1 | * | 6/2009 | Marsh ........................... 359/344 |
| 2010/0142567 | A1 | * | 6/2010 | Ward et al. ...................... 372/20 |
| 2013/0194657 | A1 | * | 8/2013 | Ishizaka ........................ 359/344 |
| 2014/0078580 | A1 | * | 3/2014 | Hasegawa et al. ............ 359/344 |

OTHER PUBLICATIONS

International Search Report PCT/ISA/210 for PCT/EP2012/056147 dated Sep. 4, 2012.
Written Opinion PCT/ISA/237 for PCT/EP2012/056147 dated Sep. 4, 2012.
Takeshi Saito et al., "Polymeric Waveguide Optical Switch With Bascule Structure Using Novel Trench Forming Process," *Journal of Lightwave Technology*, vol. 27, No. 6, Mar. 15, 2009, pp. 791-798.

* cited by examiner

SEMICONDUCTOR OPTICAL AMPLIFIER DEVICE AND OPTICAL MATRIX SWITCH

This application is the national phase under 35 U.S.C. §371 of PCT International Application No. PCT/EP2012/056147 which has an International filing date of Apr. 4, 2012, which claims priority to European patent application number 11290214.3 filed May 4, 2011; the entire contents of each of which are hereby incorporated by reference.

The present invention relates to a semiconductor optical amplifier device and an optical matrix switch.

BACKGROUND ART

Semiconductor optical amplifier devices (hereinafter referred to as "SOA devices") are devices comprising an optical amplifying medium typically in the form of at least one striped optical waveguide, that is, "an active stripe structure". When used as amplifiers, SOA devices are amplifiers for amplifying optical signals without converting it into an electric signal. The structure of these devices is basically the same as semiconductor lasers. In contrast to laser devices, the SOA devices typically have connecting end portions covered with anti-reflecting coatings to reduce their light reflectance, so that SOA devices are typically not of an optical resonator structure. Therefore, a SOA device typically outputs amplified light due to stimulated emission in response to input optical signals, but suppresses laser oscillation.

SUMMARY

The active stripe structure of an SOA device amplifies incoming optical signals when a current is injected into the active stripe structure, and exhibits a high light absorption capability when no current is injected into the active stripe structure. Therefore, the optical waveguide with the active stripe structure serving as a core layer thereof is capable of amplifying and turning on and off guided light.

Document EP 0 851 548 A1 discloses a SOA device comprising an active stripe structure with an optical amplifying medium.

There is a strong demand for switching, broadcasting and amplifying of optical signals in a highly integrated way to build big all optical cross connects or fast optical switches.

The existing solutions up to now typically comprise several optical components with which the three different functions—switching, broadcasting and amplification are done in different discrete components with even very divers technology. For switching optical blockers, MachZehnder-Modulators and (variable) optical attenuators are typically used. For broadcasting, optical splitters are typically used. Finally, existing optical amplifier devices are typically based on EDFA (Erbium-doped fiber amplifier) or SOA technologies.

Further, there is a strong demand for optical matrix switches of optical signals for cross connect applications in optical communication networks.

Today various technologies are used to build all-optical switches, like 2D-, 3D-MEMS, MZI with thermo-, piezo- or other physical effects, mechanical beam steering based on piezo-effects, micro-mirrors based on piezo-effects, etc. However such schemes typically do not scale beyond 1300×1300 switch sizes because of mechanical constraints. Such mechanical concepts typically have in addition the disadvantage that broadcasting of signals is not possible, but this is essential for telecommunication transport switches to support various network protection schemes, e.g. SNCP. Another way to build an optical switch is an optical crossbar switch.

T. Saito et al.: "Polymeric Waveguide Optical Switch With Bascule Structure Using Novel Trench Forming Process"; Journal of Lightwave Technology, Vol. 27, Issue 6, pp. 791-798 (2009) discloses an optical crossbar switch (matrix switch). One problem of this kind of crossbar switch is his power loss however. Assuming for instance a through loss of only 0.1 dB per switch point, a 1000×1000 switch would then have 100 dB loss at maximum and the loss is dependent on the switch point itself, which is not desirable.

Some embodiments of the invention provide a simple but effective optical amplifier device for switching, broadcasting and amplifying of optical signals in a highly integrated way and to provide a simple but effective optical matrix switch.

The semiconductor optical amplifier device (SOA device) according to embodiments of the invention comprises a plurality of active units and an optical splitter device. Each active unit comprises an active stripe structure of an optical amplifying medium and a current circuit for injecting current into the active stripe structure, wherein each active stripe structure extends from an input end to an output end. The optical splitter device is adapted for splitting incoming signal light and for distributing corresponding parts of this incoming signal light into the different input ends of the active stripe structures, wherein the optical splitter device is configured to supply each active stripe structure with the same signal information.

The incoming signal light enters the optical splitter device via an optical input and is guided to the optical splitter device. This optical splitter device splits the incoming signal light and distributes corresponding parts of the incoming signal light into the different input ends of the active stripe structures. Each stripe structure belongs to a corresponding active unit of the SOA device. The optical splitter supplies each active stripe structures with the same signal information, especially the complete signal information of the incoming signal light. Within the different active stripe structures, the different parts of the light signal can be manipulated individually by means of the individually addressable current circuits. After this manipulation, the (manipulated) outgoing signal light leaves the SOA device via the output end of the individual output ends of the active stripe structure and optical outputs of the SOA device.

The SOA device according to embodiments of the invention is hereinafter referred to as "n-way SOA device", wherein the n (n=2, 3, . . . ) different active stripe structures define the different ways. Depending on the different kinds of manipulation in the different active stripe structures, the SOA device can be used for switching, broadcasting and amplifying of optical signals. In this context, switching means turning on/off each individual active unit and/or switching between these active units (between these ways) and broadcasting means a trans-mission by means of all active units or at least by means of a plurality of active units (multicasting).

The optical splitter can be based on various kinds of optical elements like for example prisms, fiber optics, lenses, and combinations thereof. According to a preferred embodiment of the present invention, the optical splitter comprises a lens system with at least one lens.

According to another preferred embodiment of the present invention, at least one of the active units comprises an output reflector structure at the output end of its active stripe structure. Preferably, each of the active units comprises an output reflector structure at the output end of its active stripe structure. These individual output reflector structures allow a design of the device whereby the positions of the optical outputs are freely selectable.

An active unit can have an individual input reflector at its input end. According to a preferred embodiment of the present invention, the semiconductor optical amplifier device has a common input reflector structure spanning across a plurality of input ends of the active stripe structures. Preferably, the common input reflector structure spanning across all of input ends of the active stripe structures.

According to another preferred embodiment of the present invention, the current circuit is an individual controllable current circuit for injecting current into the corresponding active stripe structure. The circuit comprises a switching device like a transistor for controlling the injected current.

According to yet another preferred embodiment of the present invention, at least one of the active units comprises a connectible blocking device for optionally suppressing the outgoing signal light. The blocking device can be based on various different connectible blocking mechanisms. The blocking mechanisms can be for example a change of the reflectance of the output reflector or piezo effects via a separate blocking current. Preferably, all units comprise such blocking devices.

Some embodiments of the invention relate to the use of the aforementioned semiconductor optical amplifier device for switching and/or broadcasting and/or amplifying of optical signals.

SOA devices are currently promising for use as optical gate elements of such optical matrix switches, because the extinction ratio of SOA devices per switching time is typically larger than that of electro-absorption semiconductor modulators or optical directional coupler switches. Therefore the aforementioned semiconductor optical amplifier device is preferably used for switching in an optical matrix switch (optical crossbar switch).

The optical matrix switch (optical crossbar switch) according to embodiments of the invention comprises a plurality of aforementioned semiconductor optical amplifier devices connected in a matrix array by means of column waveguides and row waveguides.

According to a preferred embodiment of the present invention, each semiconductor optical amplifier device further comprises an output connection range connecting one of the output ends and/or the output reflector structures to the column waveguides and another of the output ends and/or the output reflector structures to the row waveguides of the optical matrix switch.

According to another preferred embodiment of the present invention, the output connection range comprises optical waveguides for the connection, said optical waveguides having respective diameters wherein a bend radius of an optical waveguide is larger than double the diameter of the corresponding optical waveguide.

These and other aspects of the invention will be apparent from and elucidated with reference to the embodiments described hereinafter.

DETAILED DESCRIPTION

Figure 1:
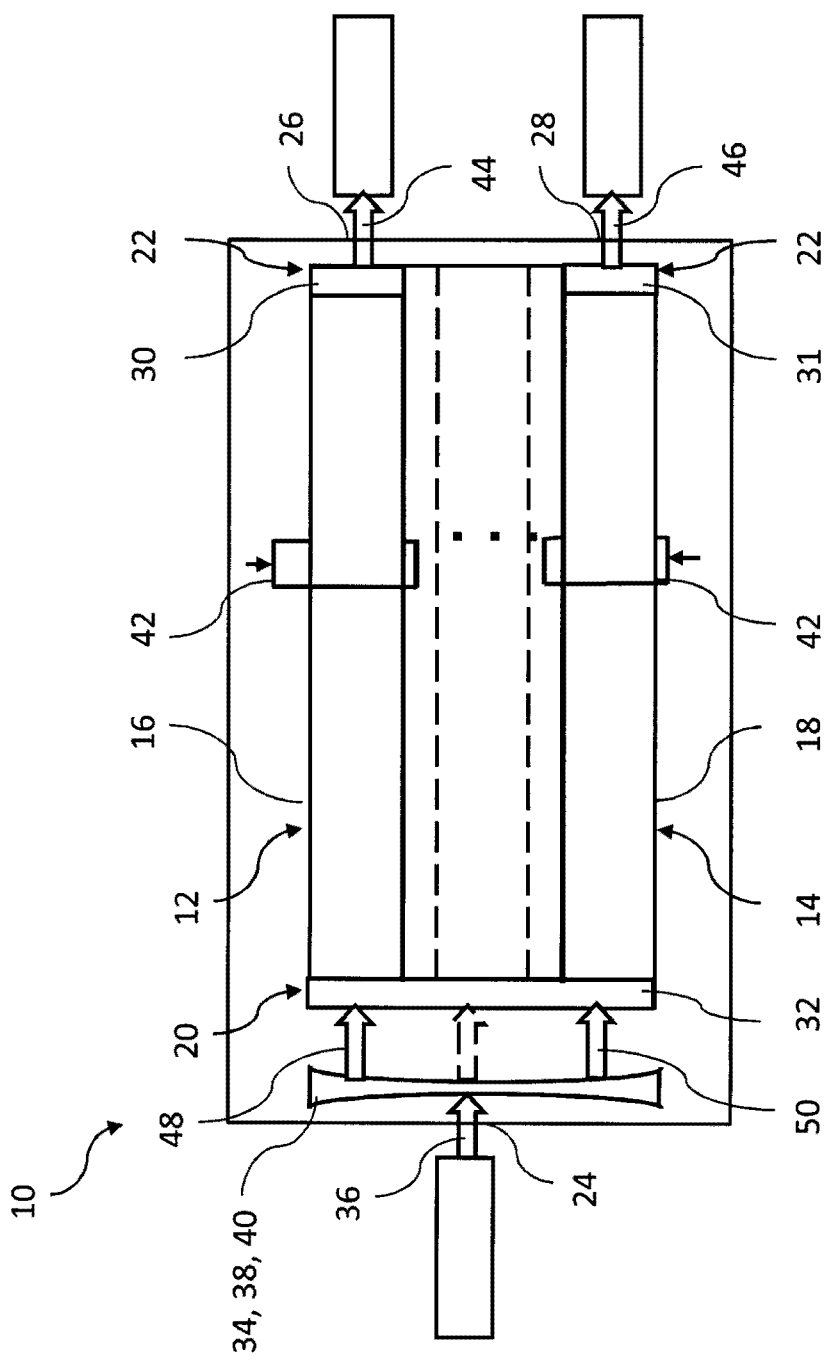
FIG. 1 is an exemplary schematic representation of a top view showing a SOA device according to a first preferred embodiment of the invention.

FIG. 1 shows an exemplary schematic representation of a semiconductor optical amplifier (SOA) device 10. The SOA device 10 comprises n (with n≥2) active units 12, 14. Each active unit 12, 14 comprise an active stripe structure 16, 18 of an optical amplifying medium and extends from an input end 20 to an output end 22. At least some or preferably all the active stripe structures 16, 18 are arranged parallel to each other having the input end 20 at one side of the SOA device 10 and the output end 22 at the opposite other side of the SOA device 10. The one side of the SOA device 10 is an input side with a single optical input 24 of the SOA device 10 and the other side is an output side with a plurality of optical outputs 26, 28 of the SOA device 10. Each optical output 26, 28 may correspond to one of the active units 12, 14.

Each active unit 12, 14 further comprises an individual output reflector structure 30, 31 located at the output end 22 of the corresponding active stripe structure 16, 18 and the corresponding optical output 26, 28, wherein each output reflector structure 30, 31 is abutting the output end 22 of the corresponding active stripe structure 16, 18. The SOA device 10 further comprises a common input reflector structure 32 spanning across a plurality of input ends 20 of the active stripe structures 16, 18 and an optical splitter device 34. The optical splitter device 34 is a device 34 for splitting incoming signal light (arrow 36) and for distributing corresponding parts of the incoming signal light into the different input ends 20 of the active stripe structures 16, 18, wherein the optical splitter device 34 supplies each active stripe structure 16, 18 with the same signal information of the incoming signal light. Said optical splitter device 34 is located between the optical input 24 of the SOA device 10 and the common input reflector structure 32 for the active units 12, 14. The optical splitter devices 34 shown in FIGS. 1, 2 and 4 may comprise a lens system 38 with a diverging lens 40.

Each active unit 12, 14 further comprises a current circuit 42 for injecting current into the corresponding active stripe structure 16, 18 for manipulating the outgoing signal light (arrows 44, 46). Herein, the term "manipulating" is meant to refer to changing the status of an optical signal as a result of changing the injected current into the device. For example the incoming optical signals may be amplified when a current is injected into the active stripe structure, and may be significantly absorbed (therefore blocked) when no current is injected into the active stripe structure.

The incoming signal light (arrow 36) enters the optical splitter device 34 via the optical input 24 and is guided to the optical splitter device 34. This optical splitter device 34 splits the incoming signal light (arrow 36) and distributes corresponding parts (arrows 48, 50) of the incoming signal light (arrow 36) into the different input ends 20 of the active stripe structures 12, 14. The optical splitter 34 supplies each active stripe structure 16, 18 with the same signal information, especially the signal information of the incoming signal light (arrow 36) is substantially identically conveyed (although split) from the optical input 24 to the active stripe structures 16, 18 through the splitter 34.

Within the different active stripe structures 16, 18, the different parts of the light signal can be manipulated individually by means of the individually addressable current circuits 42. After this manipulation, the (manipulated) outgoing signal light (arrows 44, 46) leaves the SOA device 10 via the individual output ends 22 of the active stripe structures 16, 18 and the optical outputs 26, 28 of the SOA device 10.

Figure 2:
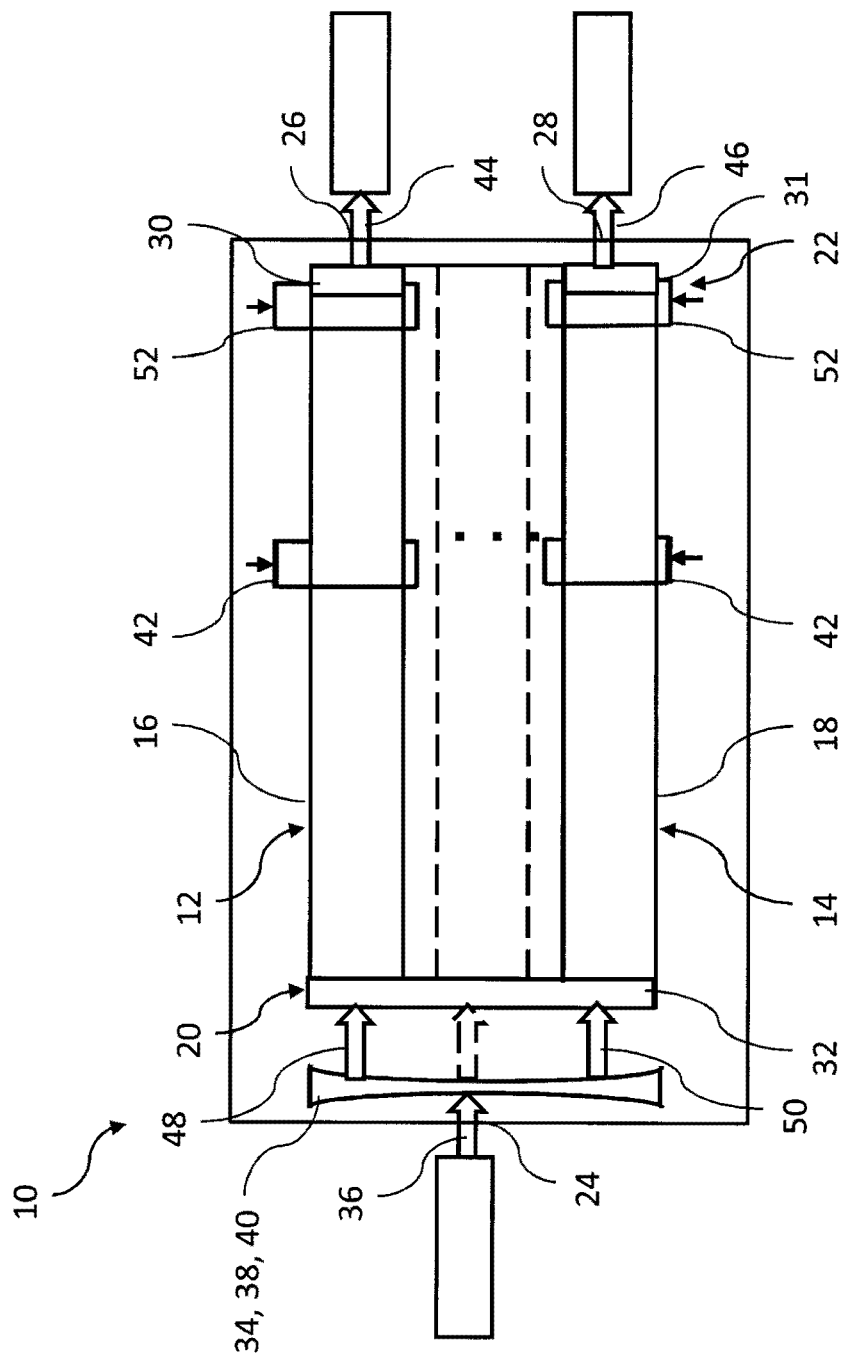
FIG. 2 is an exemplary schematic representation of a top view showing a SOA device according to a second preferred embodiment of the invention, FIG. 3 schematically depicts an exemplary optical matrix switch comprising a plurality of SOA devices according to a third preferred embodiment of the invention.

FIG. 2 shows another SOA device 10, which is structured substantially in the same way like the SOA device shown in FIG. 1. The main difference are additional connectible (non permanent) blocking devices 52 for optionally suppressing the outgoing signal light (arrows 44, 46). Each active unit 12,14 may comprise one of these connectible blocking devices 52, wherein the output reflector structures 30, 32 may be part of the blocking devices 52. The blocking device 52 can be based on various different connectible blocking mechanisms. The blocking mechanisms can be for example a change of the reflectance of the output reflector or piezo effects via a separate blocking current.

The SOA device 10 can be used for switching and/or broadcasting and/or amplifying of optical signals.

One advantage of this SOA device 10 is that it allows for combining the individual functions (switching and/or broadcasting and/or amplifying) of at least three discrete elements (as is typically the case in conventional solutions) into one element which can be highly integrated in an optical integrated circuit. High integration is becoming highly desirable in the optical processing domain.

Figure 3:
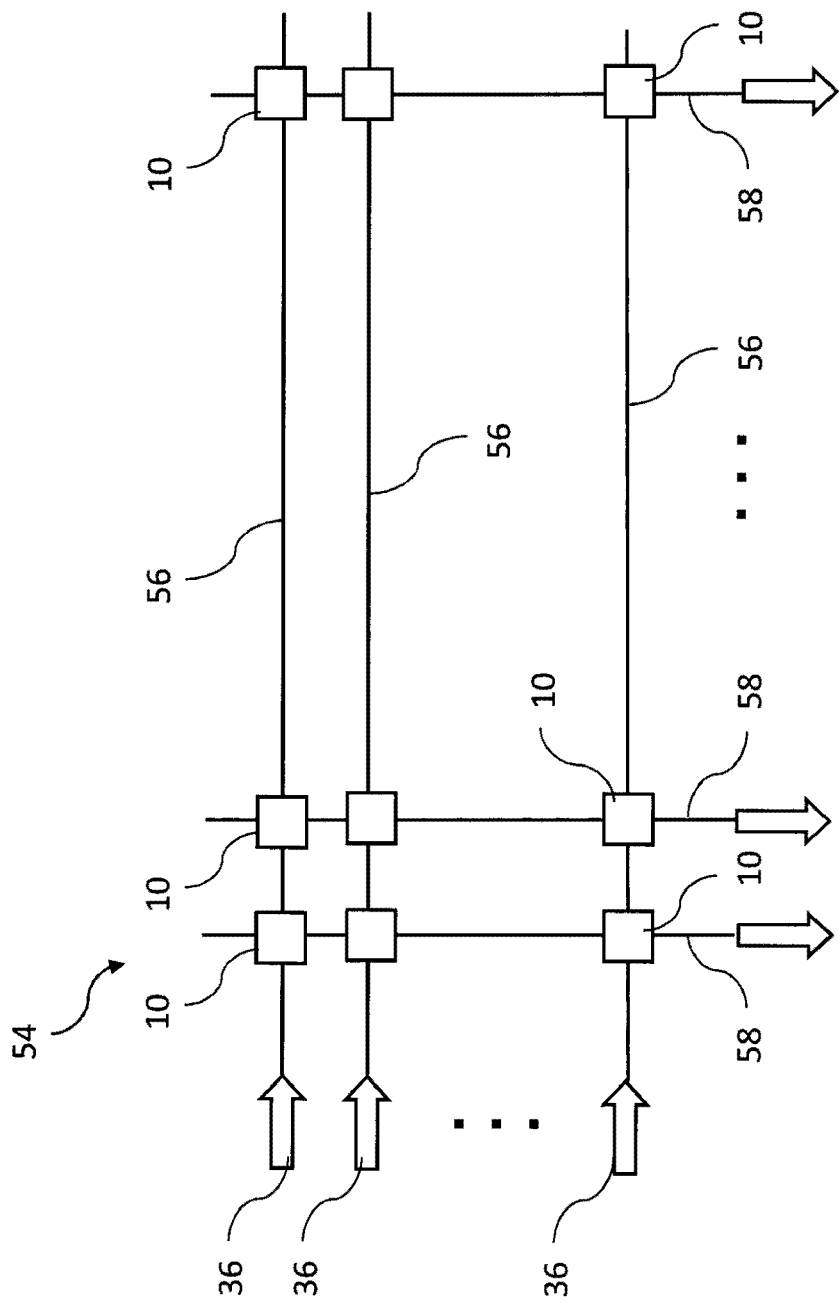
Figure 4:
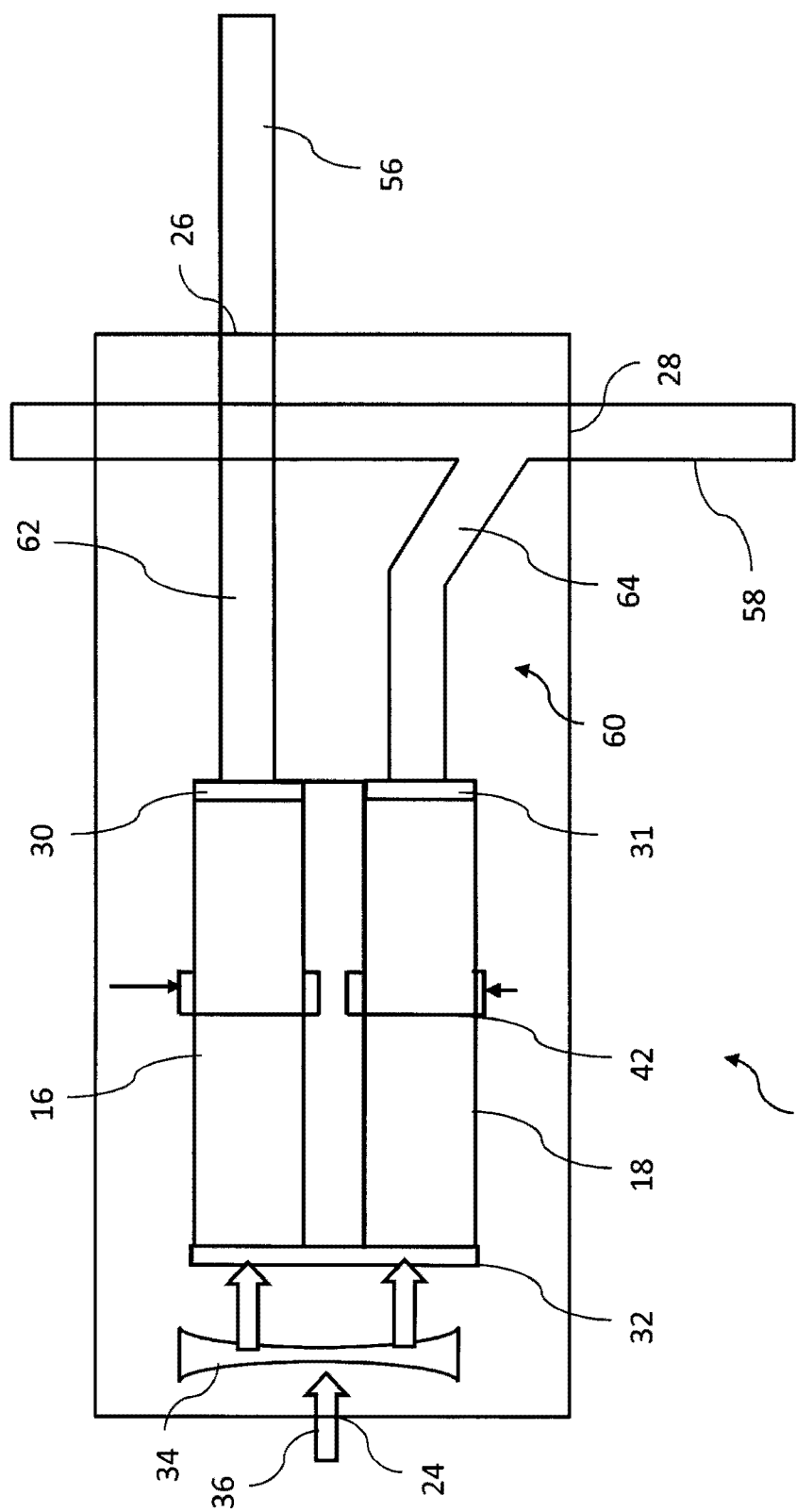
FIG. 4 is an exemplary schematic representation of a top view showing a SOA device with an output connection range connecting the output ends and/or the output reflector to column waveguides and row waveguides of the optical matrix switch shown in FIG. 3.

FIG. 3 shows an optical matrix switch (optical crossbar switch) 54 comprising a plurality of SOA devices 10 as shown in FIG. 4. The SOA devices are connected in a matrix array by means of row waveguides 56 and column waveguides 58 (cross connects).

Preferably each SOA device 10 of the optical matrix switch 54 further comprises an output connection range 60 (as depicted in FIG. 4) connecting the output reflector structures 30, 31 at the output ends 22 to a corresponding row waveguide 56 and column waveguide 58 of the optical matrix switch 54. The output connection range 60 comprises optical waveguides 62, 64 having a respective diameter. In case such waveguides are bent, the bend radius of each of these optical waveguides 62, 64 is larger than double the diameter of the corresponding waveguide 62, 64 to ensure sufficient light guiding features of the waveguides 62, 64.

A crossbar is a known structure for building electrical cross connects. Such structure may be made as single stage or multi-stage (e.g. CLOS architectures) as is known in the related art. Therefore, SOA devices 10 with two active units 12, 14 (2-way SOA devices 10) according to embodiments described herein may be used to build an optical crossbar switch 54. At each cross connection point a 2-way SOA device 10 may be used to
a) provide a substantially loss-less path for the incoming signal light (arrow 36) to the next 2-way SAO device 10 functioning as a switching point and
b) switch to the optical output 28, if this is the desired input signal or to switch the optical outputs 26, 28 in case of broad-/multicast the signal to numerous outputs.

FIG. 4 shows more details of the device 10 used as a switching point in the optical matrix switch 54. The incoming light on the left hand side of the figure is normally loss-lessly switched through in the first active unit 12 (not shown) of the 2-way SOA device 10 to the output which is connected to the row waveguide (so-called horizontal waveguide) 56, with that the incoming signal light is available to every switch point of the corresponding row. With the second active unit 14 (not shown) of the 2-way SOA device 10, the incoming signal could be switched to the output 28 according to the connection request. The signal from the output reflector structure 31 will be fed into the column waveguide (so-called vertical waveguide) 58 with which one output is connected to all switch points. Normally this can be done using an "optical combiner" structure. Since the incoming signal may become available at all outgoing signals, multi-cast and broadcast of the incoming signal can easily be done.

A combination of active SOA devices 10 and passive devices can be thought of as well, e.g. having only every 10th crossing as an active device (used as a switch) and e.g. 9 passive switches in between. Passive switches are known in literature, e.g. the above-mentioned article in Journal of Lightwave Technology, Vol. 27, Issue 6, pp. 791-798 (2009).

While embodiments of the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A semiconductor optical amplifier device comprising:
a plurality of active units, each active unit comprising an active stripe structure of an optical amplifying medium, a current circuit for injecting current into the active stripe structure and an individual output reflector structure at an output end of its active stripe structure;
wherein each active stripe structure extends from an input end to the output end;
an optical splitter device for splitting incoming signal light and for distributing corresponding parts of the incoming signal light into the different input ends of the active stripe structures, wherein the optical splitter device is configured to supply each active stripe structure with the same signal information; and
a common input reflector structure spanning across the plurality of input ends of the active stripe structures.

2. The semiconductor optical amplifier device according to claim 1, wherein the optical splitter device comprises a lens system with at least one lens.

3. The semiconductor optical amplifier device according to claim 1, wherein at least one of the active units comprises an output reflector structure at the output end of its active stripe structure.

4. The semiconductor optical amplifier device according to claim 1, wherein the semiconductor optical amplifier device has a common input reflector structure spanning across a plurality of input ends of the active stripe structures.

5. The semiconductor optical amplifier device according to claim 1, wherein the current circuit is an individual controllable current circuit for injecting current into the corresponding active stripe structure.

6. The semiconductor optical amplifier device according to claim 1, wherein at least one of the active units comprises a connectible blocking device for optionally suppressing the outgoing signal light.

7. Use of a semiconductor optical amplifier device according to claim 1 for switching and/or broadcasting and/or amplifying of optical signals.

8. An optical matrix switch comprising a plurality of semiconductor optical amplifier devices according to claim 1 connected in a matrix array by means of column waveguides and row waveguides.

9. The optical matrix switch according to claim 8, wherein each semiconductor optical amplifier device further comprises an output connection range connecting one of the output ends and/or the output reflector structures to the column waveguides and another of the output ends and/or the output reflector structures to the row waveguides of the optical matrix switch.

10. The optical matrix switch according to claim 9, wherein the output connection range comprises optical waveguides for the connection, said optical waveguides having respective diameters wherein a bend radius of an optical waveguide is larger than double the diameter of the corresponding optical waveguide.

\* \* \* \* \*